US009261360B2

(12) United States Patent
Okai et al.

(10) Patent No.: US 9,261,360 B2
(45) Date of Patent: Feb. 16, 2016

(54) CHARGED PARTICLE BEAM MICROSCOPE

(75) Inventors: Nobuhiro Okai, Otsu (JP); Yasunari Sohda, Kawasaki (JP); Junichi Tanaka, Hachioji (JP)

(73) Assignee: Hitachi High-Technologies Corporation, Tokyo (JP)

( * ) Notice: Subject to any disclaimer, the term of this patent is extended or adjusted under 35 U.S.C. 154(b) by 437 days.

(21) Appl. No.: 13/580,875

(22) PCT Filed: Feb. 22, 2011

(86) PCT No.: PCT/JP2011/053857
§ 371 (c)(1),
(2), (4) Date: Sep. 14, 2012

(87) PCT Pub. No.: WO2011/108402
PCT Pub. Date: Sep. 9, 2011

(65) Prior Publication Data
US 2012/0327213 A1    Dec. 27, 2012

(30) Foreign Application Priority Data
Mar. 2, 2010    (JP) .................. 2010-045545

(51) Int. Cl.
*G01B 15/00*    (2006.01)
*H01J 37/285*    (2006.01)
(Continued)

(52) U.S. Cl.
CPC .............. *G01B 15/00* (2013.01); *G01B 15/04* (2013.01); *H01J 37/28* (2013.01); *H01J 2237/2067* (2013.01); *H01J 2237/221* (2013.01);
(Continued)

(58) Field of Classification Search
CPC ............... H01J 2237/2817; H01J 2237/128; H01J 2237/2816; H01J 37/3045; H01J 37/2088; H01J 37/2446; G02B 21/365; G01B 15/00; G01N 2223/418; G06T 2207/20148; G06T 2207/2207; G06T 2207/11006; G06T 2207/13014; G06T 2200/24; G06T 7/0002
USPC .................. 348/80, 87, 126; 250/307, 310; 382/145, 149
See application file for complete search history.

(56) References Cited

U.S. PATENT DOCUMENTS 6,476,388 B1 * 11/2002 Nakagaki et al. ............... 850/9
6,583,413 B1 *  6/2003 Shinada et al. ............... 850/9
(Continued)

FOREIGN PATENT DOCUMENTS

JP      5-29424 A     2/1993
JP   2005-338102 A   12/2005
(Continued)

OTHER PUBLICATIONS

International Search Report dated May 31, 2011 (four (4) pages).

*Primary Examiner* — Brian Yenke
(74) *Attorney, Agent, or Firm* — Crowell & Moring LLP

(57) ABSTRACT

Disclosed is a charged particle beam microscope which can obtain information about pattern materials and stereostructure without lowering throughput of pattern dimension measurement. To achieve this, the charged particle beam microscope acquires a plurality of frame images by scanning the field of view of the sample (S304, 305), adds the images together (S307), computes the dimensions of the pattern formed on the sample (308) and at the same time acquires pattern information (314) using components of a frame image, such as a single frame image or subframe image, as a separated image (309, 310).

8 Claims, 11 Drawing Sheets

(51) Int. Cl.
*G01B 15/04* (2006.01)
*H01J 37/28* (2006.01)

(52) U.S. Cl.
CPC .............. *H01J2237/24578* (2013.01); *H01J 2237/2817* (2013.01)

(56) References Cited

U.S. PATENT DOCUMENTS

| | | | |
|---|---|---|---|
| 7,285,777 | B2 | 10/2007 | Kawada et al. |
| 7,659,508 | B2 | 2/2010 | Nasu et al. |
| 7,910,886 | B2* | 3/2011 | Kawada et al. ............. 250/310 |
| 8,094,920 | B2* | 1/2012 | Sugiyama et al. ............ 382/141 |
| 8,515,155 | B2* | 8/2013 | Toyoda et al. ............... 382/145 |
| 8,698,081 | B2* | 4/2014 | Nakamura et al. ........... 250/310 |
| 2003/0111602 | A1* | 6/2003 | Sato et al. .................... 250/310 |
| 2003/0141451 | A1* | 7/2003 | Sato et al. .................... 250/310 |
| 2004/0051040 | A1* | 3/2004 | Nasu et al. ................... 250/310 |
| 2006/0038125 | A1* | 2/2006 | Tsuneta et al. ............... 250/310 |
| 2006/0151697 | A1* | 7/2006 | Inada et al. .................. 250/310 |
| 2006/0188216 | A1* | 8/2006 | Maeda .......................... 386/46 |
| 2006/0245636 | A1* | 11/2006 | Kitamura et al. ............ 382/149 |
| 2008/0159609 | A1* | 7/2008 | Miyamoto et al. ........... 382/128 |
| 2008/0215260 | A1* | 9/2008 | Kobaru .......................... 702/57 |
| 2008/0224039 | A1* | 9/2008 | Nakamura et al. ........... 250/310 |
| 2009/0231424 | A1* | 9/2009 | Honda et al. .................. 348/87 |
| 2009/0295914 | A1* | 12/2009 | Sato et al. ...................... 348/80 |
| 2011/0098960 | A1* | 4/2011 | Mizuochi ....................... 702/95 |
| 2011/0187847 | A1* | 8/2011 | Bai et al. ........................ 348/80 |
| 2011/0249110 | A1* | 10/2011 | Okai et al. ..................... 348/80 |
| 2011/0285839 | A1* | 11/2011 | Kotaki et al. .................. 348/80 |
| 2011/0286685 | A1* | 11/2011 | Nishihara et al. ............. 382/286 |
| 2011/0298915 | A1* | 12/2011 | Hiroi et al. .................... 348/80 |
| 2012/0019648 | A1* | 1/2012 | Hoshino et al. ................ 348/80 |
| 2012/0092482 | A1* | 4/2012 | Shinoda et al. ................ 348/80 |
| 2012/0212602 | A1* | 8/2012 | Hitomi et al. .................. 348/80 |
| 2012/0257041 | A1* | 10/2012 | Nakagaki et al. .............. 348/80 |
| 2012/0300056 | A1* | 11/2012 | Ban et al. ....................... 348/80 |
| 2012/0327212 | A1* | 12/2012 | Kitahashi et al. .............. 348/80 |
| 2013/0010100 | A1* | 1/2013 | Kotaki et al. .................. 348/80 |
| 2013/0235182 | A1* | 9/2013 | Ono et al. ...................... 348/80 |
| 2013/0265408 | A1* | 10/2013 | Yamaguchi et al. ........... 348/80 |
| 2013/0271595 | A1* | 10/2013 | Hiroi et al. ..................... 348/80 |
| 2013/0278745 | A1* | 10/2013 | Kamio et al. ................... 348/80 |
| 2013/0307960 | A1* | 11/2013 | Bahm et al. .................... 348/80 |
| 2013/0321610 | A1* | 12/2013 | Momonoi et al. .............. 348/80 |
| 2014/0036058 | A1* | 2/2014 | Takahashi ....................... 348/80 |
| 2014/0146160 | A1* | 5/2014 | Potocek et al. ................. 348/80 |
| 2014/0210982 | A1* | 7/2014 | Zuo et al. ....................... 348/80 |
| 2014/0375793 | A1* | 12/2014 | Harada et al. .................. 348/80 |

FOREIGN PATENT DOCUMENTS

| | | |
|---|---|---|
| JP | 2007-3535 A | 1/2007 |
| JP | 2008-232818 A | 10/2008 |
| JP | 2009-135273 A | 6/2009 |

\* cited by examiner

Prior Art

OBSERVATION OF TONE VALUE CHANGE

CONDUCTOR  INSULATOR

CHARGED PARTICLE BEAM MICROSCOPE

TECHNICAL FIELD

The present invention relates to a charged particle beam microscope and more particularly to a charged particle beam microscope including a scanning electron microscope for measuring a sample as a measuring object which may change in shape or be charged by electron beam irradiation.

BACKGROUND ART

A charged particle beam microscope, for example, a scanning electron microscope, is an instrument which irradiates a sample with a narrow electron beam, detects secondary electrons or reflected electrons generated by electron beam irradiation, and modulates the brightness according to the detection signal to form an image.

In the semiconductor manufacturing process, with the trend toward finer patterns, there is demand for an instrument which provides high measurement accuracy. As a dimension measuring tool for measuring the widths of fine patterns on the order of dozens of nanometers which can not be measured by an optical measuring instrument, a scanning electron microscope (length measurement SEM) for pattern width measurement which can take images of such patterns at a magnification ratio of 100,000 or more is employed.

In a scanning electron microscope used for this purpose, generally a plurality of frame images acquired by scanning an area including the pattern to be observed are added together to make an image for length measurement and the obtained image for length measurement is analyzed using various length measurement algorithms in order to compute pattern dimensions with high accuracy. Here, an image acquired by scanning the field of view for observation once is defined as a frame image and an image obtained by adding a plurality of frame images together is defined as an image for length measurement.

While the length measurement SEM is used for the purpose of measuring the dimensions of a pattern formed on a semiconductor substrate, it is not only used for that purpose but also in order to obtain pattern information about the materials and stereostructure by acquiring a plurality of images for length measurement and observing change of the acquired images over time. Among typical examples of pattern information which changes over time due to electron beam irradiation are shrinkage of resist patterns shrinkage and electrification of sample surfaces. The acquisition of pattern information using information about such change over time is used for measurement of the amount of resist shrinkage, Line-Space discrimination, and presumption of materials.

Photoresist for an ArF (wavelength 193 nm) exposure apparatus which has been used recently in the fabrication of semiconductor devices has a problem that it is damaged by electron beam irradiation, resulting in volume shrinkage. For a semiconductor device to demonstrate performance as designed, strict control of the shapes and dimensions of circuit patterns is needed in the semiconductor manufacturing process, but when a resist pattern is observed using a scanning electron microscope, shrinkage occurs and the original dimensions of the pattern could not be measured correctly.

In order to address this problem, according to Patent Literature 1, the magnification in the Y direction horizontal to a pattern is set lower than in the X direction vertical to the pattern to decrease the electron beam irradiation density to suppress shrinkage and compute pattern dimensions correctly. According to Patent Literature 2, even if shrinkage occurs, dimensions before shrinkage are computed by fitting an approximate function indicating transition of measured length values and shrinkage to experimental values.

Furthermore, since the base material of resist is made of insulator such as acrylic resin, a sample irradiated with an electron beam is charged, namely charge is accumulated on the sample surface. If charging occurs, shading contrast would change and it becomes impossible to discriminate whether the pattern being measured is a pattern to remain intact (Line pattern) or a portion to be lost (Space pattern). In order to address this problem, according to Patent Literature 3, the resist pattern outside and inside dimensions of two resist pattern images are measured and whether the resist pattern is a portion to remain intact or a portion to be lost is determined by comparison of length measurement values.

Furthermore, according to Patent Literature 4, an unknown substance can be identified by measuring the signal waveform of reflected electrons corresponding to the number of electron beam scans made until electrification on a substrate reaches an equilibrium state and comparing it with data on a known substance.

CITATION LIST

Patent Literature

Patent Literature 1: Japanese Patent Application Laid-Open Publication No. 2007-003535
Patent Literature 2: Japanese Patent Application Laid-Open Publication No. 2005-338102
Patent Literature 3: Japanese Patent Application Laid-Open Publication No. 2008-232818
Patent Literature 4: Japanese Patent Application Laid-Open Publication No. 05-029424

SUMMARY OF INVENTION

Technical Problem

Although the above conventional techniques make it possible to obtain pattern information in addition to dimensional information using a scanning electron microscope, these techniques require acquisition of a plurality of images for length measurement in order to obtain pattern information, which causes a drop in throughput.

An object of the present invention is to provide a charged particle beam microscope which can obtain information about the materials and stereostructure of a pattern without lowering throughput of pattern dimension measurement.

Solution to Problem

As an embodiment to achieve the above object, a charged particle beam microscope which includes a microscope unit having a charged particle source, a sample stage, and a detector for detecting charged particles from a sample placed on the sample stage due to irradiation with charged particles emitted from the charged particle source, and a control unit having a data processing section for converting a detection signal from the detector into a frame image and adding together a plurality of the frame images to make an image for length measurement, an image memory for saving the frame images, and an arithmetic processing section for computing dimensions of a pattern formed on the sample from the image for length measurement is characterized in that the data processing section has a function to form a multiple frame image by adding a smaller number of frames than the number of frames constituting the image for length measurement or a single frame image or a subframe image, as a separated image.

Also a charged particle beam microscope which acquires a plurality of frame images by scanning the field of view of a sample and computes dimensions of a pattern formed on the sample using an image for length measurement made by adding together a plurality of images is characterized in that information about the materials and stereostructure of a pattern is created using a separated image constituted of an image made by adding together a smaller number of frames than the number of acquired frames or a single frame image or subframe image.

Advantageous Effect of Invention

It is possible to provide a charged particle beam microscope which can obtain information about the materials and stereostructure of a pattern without lowering throughput of pattern dimension measurement, by using an image (separated image) constituting an image for length measurement.

BRIEF DESCRIPTION OF DRAWINGS

FIGS. 6A, 6B and 6C are views illustrating a measured dimension difference between two patterns with different cross-sectional shapes as measuring object patterns, in which FIG. 6A is a sectional view of a non-tapered pattern, FIG. 6B is a sectional view of a forwardly tapered pattern, and FIG. 6C is a schematic diagram of a planar SEM image of a pattern.

FIGS. 7A and 7B are pattern sectional views illustrating shrinkage upon electron beam irradiation and measured dimensions, in which FIG. 7A shows the case of the pattern shown in FIG. 6A and FIG. 7B shows the case of the pattern shown in FIG. 6B.

FIGS. 9A and 9B are views showing the process of calculating dimensions before shrinkage, in which FIG. 9A shows the case of using a conventional scanning electron microscope and FIG. 9B shows the case of using a scanning electron microscope according to a second embodiment.

FIGS. 12A, 12B and 12C are views illustrating the process of discriminating Line and Space using a scanning electron microscope according to a third embodiment, in which FIG. 12A is a schematic diagram of a planar SEM image of a pattern, FIG. 12B shows change in length measurement value over time, and FIG. 12C shows the result of judgment.

FIGS. 14A, 14B and 14C are views illustrating the process of presuming materials using a scanning electron microscope according to a fourth embodiment, in which FIG. 14A is a schematic diagram of a planar SEM image of a pattern, FIG. 14B shows change in tone value over time, and FIG. 14C shows the result of presumption.

DESCRIPTION OF EMBODIMENTS

Next, embodiments will be described.

First Embodiment

Figure 1:
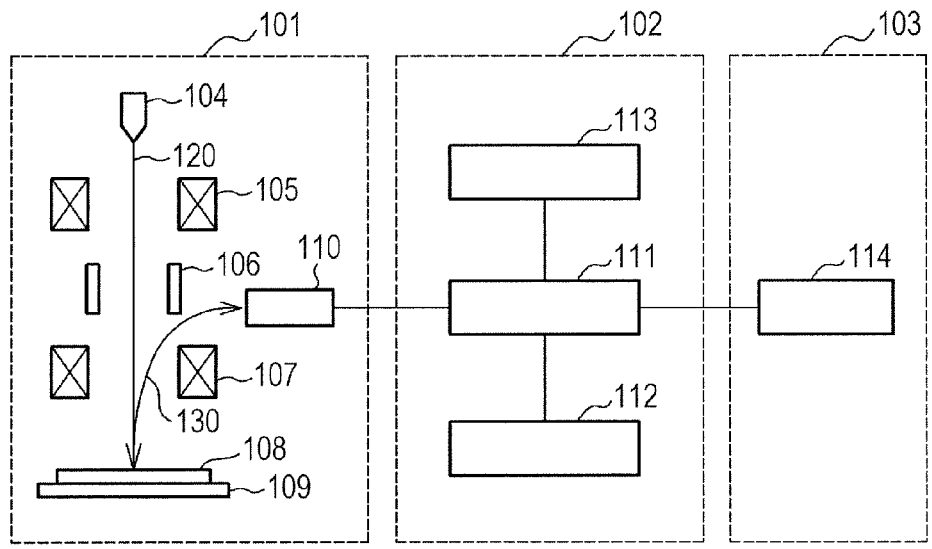
FIG. 1 is a view showing the general configuration of a scanning electron microscope according to a first embodiment.

A first embodiment will be described referring to FIG. 1 to FIG. 8. FIG. 1 is a view showing the configuration of a scanning electron microscope according to this embodiment. This device has a function to make an image for length measurement by adding together frame images and measure lengths and makes it possible to obtain pattern information from change over time of plural frame images constituting the image for length measurement. Here, an image made by adding together plural frame images acquired by scanning the field of view once is defined as an image for length measurement.

The scanning electron microscope with a function to obtain pattern information includes an electron microscope unit 101, a control unit 102, and a display unit 103. An electron beam 120 emitted from an electron source 104 is converged by a condenser lens 105 and an objective lens 107 and then thrown on a sample 108 placed on a sample stage 109. The electron beam is scanned over the sample two-dimensionally by a deflector 106. Secondary electrons 130 or reflected electrons 130 generated from the sample are detected by a detector 110 and the signal is brightness-modulated and converted into a frame image in a data processing section 111 and saved in an image memory 112.

For frame images saved in the image memory 112, pattern information is obtained from change of plural images over time in an arithmetic processing section 113. At the same time of obtainment of pattern information, the plural frame images saved in the image memory 112 are added together in the data processing section 111 to get an image for length measurement.

After that, the pattern information is added to the image for length measurement, which is displayed on a monitor 114. At this time, pattern dimensions are computed from the image for length measurement in the arithmetic processing section 113. The pattern information may be added to the image, but instead it may be added as text data to a condition file for the image for length measurement. The function of the data processing section 111 and the function of the arithmetic processing section 113 can be performed by a CPU respectively and the image memory 112 may be provided in a memory section connected to the CPU. These may be each constituted as dedicated hardware.

In measurement with a scanning electron microscope, usually an image for length measurement which is acquired by scanning the field of view more than once is used. Here, "measurement" means computation of dimensions of a pattern formed, for example, on a semiconductor wafer. An image for length measurement as acquired by scanning a sample more than once is better in terms of S/N ratio than a frame image acquired by scanning it only once, so higher length measurement accuracy is achieved; however, even if the sample shape or charge distribution changes during plural scans, pattern information on these is lost and only averaged information is obtained. Although a scanning electron microscope for length measurement is used in this way because it is intended to compute the dimensions of a pattern to be observed, it later becomes necessary to obtain pattern information in addition to dimension measurement, so in this embodiment, a function to obtain pattern information is newly added to a general scanning electron microscope.

Figure 2:
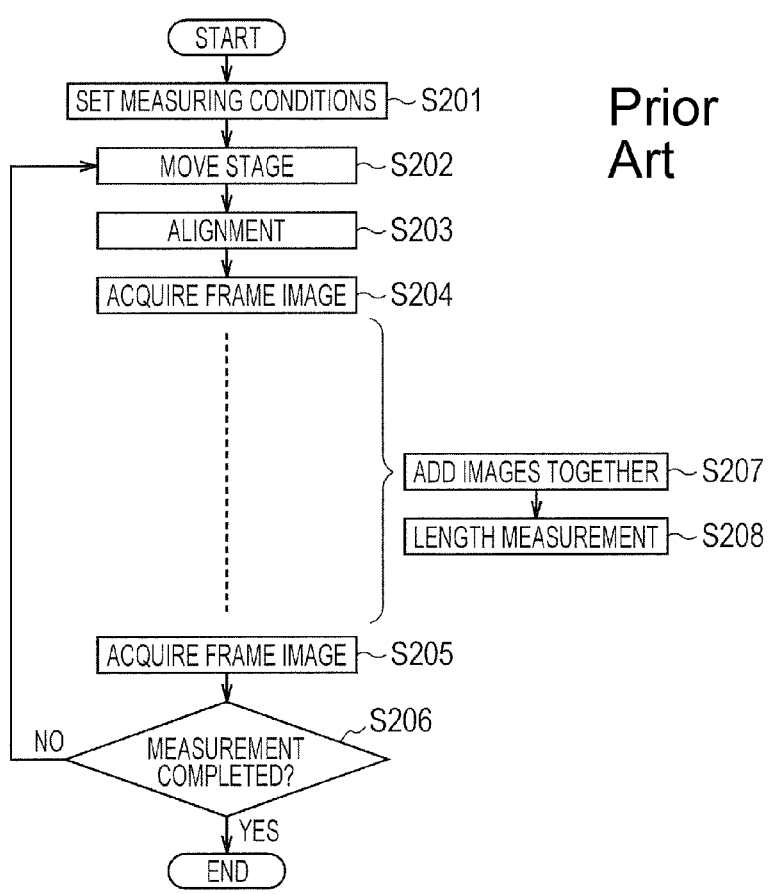
FIG. 2 is a flowchart showing the sequence of measuring pattern dimensions using a conventional scanning electron microscope.

FIG. 2 is a flowchart showing the sequence of measuring pattern dimensions using a conventional scanning electron microscope. Next, this flowchart will be explained.

First, measuring conditions are set (S201). Here, measuring conditions include device conditions such as acceleration voltage, coordinates of measuring points, pattern shape, and length measuring conditions. Then, the stage is moved to a measuring point (S202). Then, the position for irradiation with an electron beam is finely adjusted by the deflector 106 so that the target pattern is included in the field of view (S203). If the stage moving accuracy is sufficient, the step S203 need not be carried out.

Next, as many frame images as set at S201 are acquired successively in the same field of view (S204, S205). After the preset number of images have been acquired, whether the measurement process is ended or not is decided (S206) and if there is other data to be obtained, the sequence returns to S202 and the same steps are repeated.

Also, at the same time of the above steps, the frame images acquired at S204 and S205 are added together to make an image for length measurement (S207) and the image is saved in the image memory 112. At this time, the frame images are not saved in the image memory 112 because they are overwritten. Last, pattern dimensions are computed using the image for length measurement acquired at S207 (S208).

Figure 3:
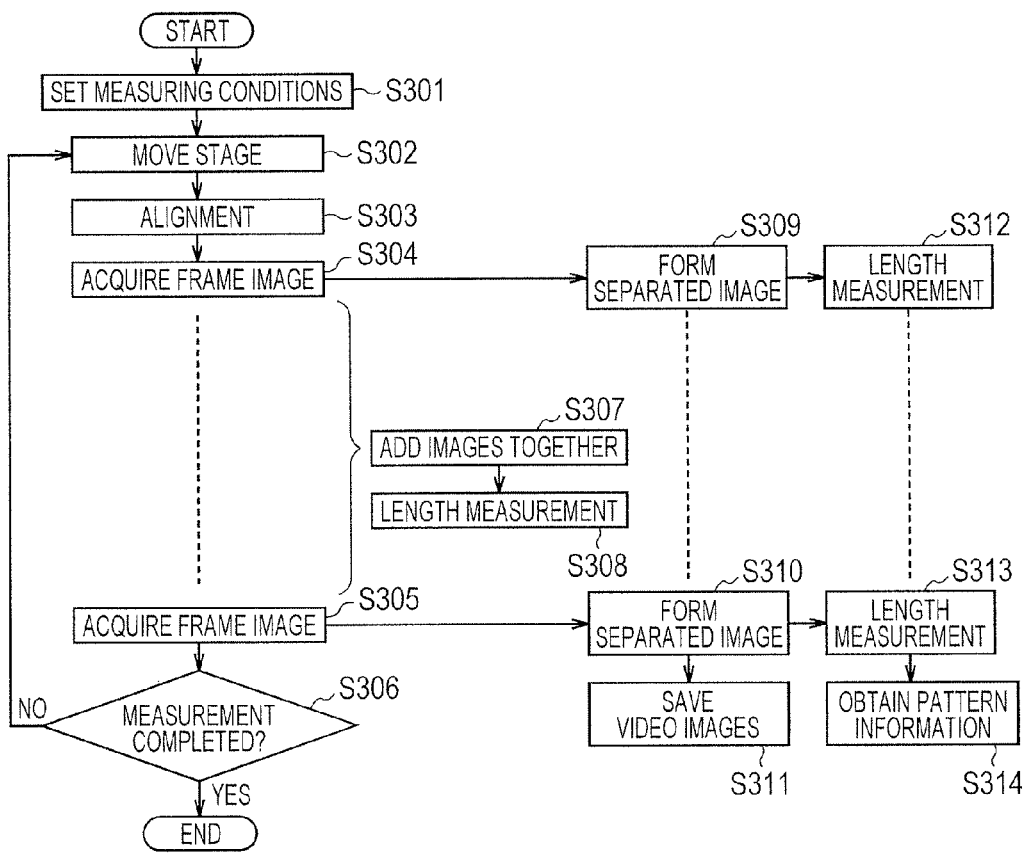
FIG. 3 is a flowchart showing the sequence of obtaining pattern dimensions and pattern information using the scanning electron microscope according to the first embodiment.

Next, the flowchart of processing by the scanning electron microscope with a function to obtain pattern information in addition to dimension computation without lower throughput according to this embodiment is shown in FIG. 3. The steps for dimension computation are the same as in FIG. 2 and here the processing flow related to the function to obtain pattern information as a newly added function is explained. S301 to S304 are the same steps as S201 to S204. At S301, conditions for obtaining pattern information are included in addition to the measuring conditions set at S201.

First, the frame images acquired at S305 and S306 are saved in the image memory 112 (S309, S310). At this time, the frame images are saved not only in image format but also in video image format (S311).

Next, length measurement values of the frame images saved at S309 and S310 are computed (S312, S313). If the length measurement accuracy of the frame images is not sufficient, the clearness of the frame images is improved by a known image processing technique. For image processing to improve the image clearness, a technique to emphasize an edge in the image using an image filter may be adopted, but not only the use of an image filter but also any other technique may be adopted as far as the measurement accuracy is improved.

Last, pattern information is obtained using the length measurement values of the frame images acquired at S312 and S313 (S314). The steps from S309 to S314 may be carried out during the stage moving period or the like. Therefore, even when these steps to obtain pattern information are added, throughput in pattern dimension measurement is hardly lowered.

While pattern information is obtained by frame-by-frame analysis in this embodiment, instead an image used to obtain pattern information may be an image made by adding together a smaller number of frames than the number of frames constituting an image for length measurement, or a single frame image or subframe images. Such an image used to obtain pattern information is defined as a separated image. The formation of separated images is performed in the data processing section.

Figure 4:
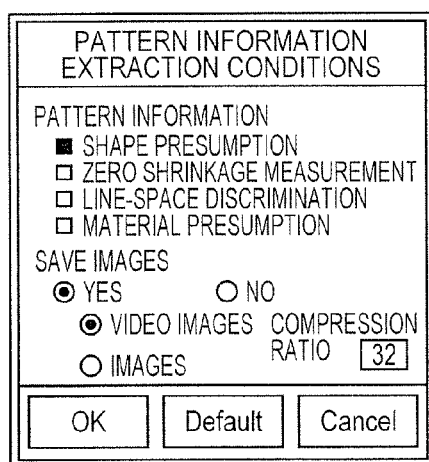
FIG. 4 is a view showing an example of GUI for setting conditions to obtain pattern information using the scanning electron microscope according to the first embodiment.

In connection with the step S301 to set the conditions for obtainment of pattern information in this embodiment, FIG. 4 shows an example of GUI (Graphical User Interface) to set up the environment to obtain pattern information. First, the pattern information to be obtained when an image is observed is selected. Pattern information options are shape presumption, zero shrinkage measurement, Line-Space discrimination, and material presumption and more than one pattern information option can be selected at a time.

In addition, whether the separated images used to obtain pattern information are saved or not can be selected. As the saving format, either image format or video image format can be selected and in video image format the volume can be reduced to one fifth to one tenth of that in image format. Although the MPEG4 (Moving Picture Experts Group) format which permits high compression is generally used as the video image format, video images may be saved in another video image format in order to accommodate the image analysis software format. Also, the compression ratio of video images can be selected. The compression ratio can be specified from 0 to 255 by eight bits and as the compression ratio is increased, the video image volume can be reduced but image information is decreased so data accuracy declines.

The purpose of saving data in video image format is to decrease the volume while maintaining data accuracy and the optimum compression ratio depends on the required data accuracy of pattern information to be obtained. For example, in the technique of checking the three-dimensional shape difference of resist patterns, it is necessary to measure the difference in the change in length measurement values between two patterns, so a low compression ratio must be set to increase the data accuracy. On the other hand, in Line-Space discrimination, it is sufficient to find the characteristics of increase or decrease in length measurement values, so in order to decrease the data volume, a high compression ratio is set. The items shown in FIG. 4 may be displayed not on a single screen but on two or more screens.

Figure 5:
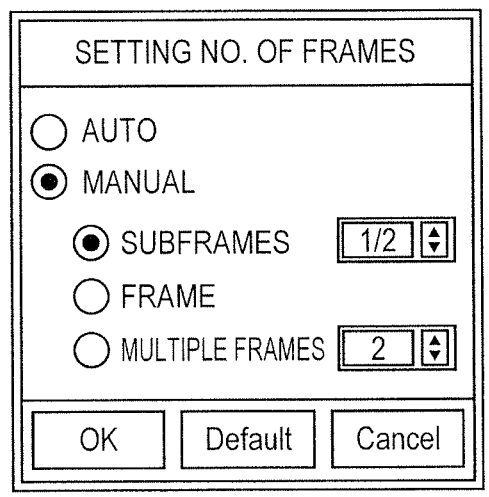
FIG. 5 is a view showing an example of GUI for selecting the number of frames of a separated image to analyze pattern information using the scanning electron microscope according to the first embodiment.

FIG. 5 shows an example of GUI for selecting the number of frames of a separated image to analyze pattern information. The options for the number of frames are subframes, a frame, and, multiple frames. For subframes and multiple frames, a further detailed setting can be made. The number of frames can be changed according to the target pattern information and by this change, pattern information can be obtained with higher accuracy. The number of frames can be specified individually but also an adequate value can be set automatically according to pattern information. The number of frames of a separated image which is suitable for each piece of pattern information will be explained on each piece of pattern information.

In connection with the step S314 to obtain pattern information using a plurality of frame images in this embodiment, each piece of pattern information which is obtained will be explained below.

Figure 6A:
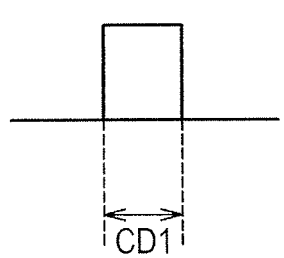
Figure 6B:
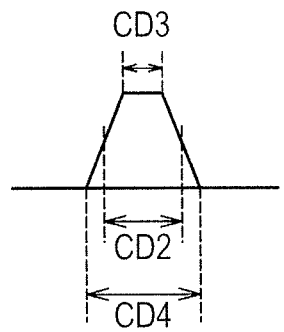
Figure 6C:
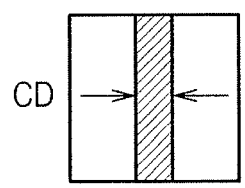

FIG. 6 are views showing length measurement values obtained from two pattern shapes. The scanning electron microscope makes an image using secondary electrons generated when these patterns are irradiated with an electron beam from above, in order to measure dimensions. FIG. 6C shows an example of an SEM image.

Pattern dimensions are measured as length measurement values CD by detecting pattern edges in accordance with various length measurement algorithms. Therefore, length measurement values CD are sensitive to change in pattern width but not sensitive to change in cross-sectional shape. For example, in a non-tapered pattern as shown in FIG. 6A, CD1 is measured as a pattern dimension. On the other hand, in a forwardly tapered pattern as shown in FIG. 6B, generally distance CD2 between points corresponding to half of the pattern height is measured as a pattern dimension.

The dimension CD2 measured here is different from top width CD3 and bottom width CD4. If CD1 and CD2 are equal, the two patterns shown in FIG. 6 would be recognized as patterns of the same shape. Such a phenomenon that the length measurement values obtained by the scanning electron microscope are equal but the pattern shapes are different poses a problem in observation of developed resist patterns in the photolithographic process.

The step after development is a step of etching an underlying layer and the bottom width of the resist pattern as the developed pattern is important. In the case of FIG. 6A, there is no problem because the obtained length measurement value corresponds to the bottom width of the pattern, but in the case of FIG. 6B, the bottom width CD4 is different from the length measurement value CD2 obtained by the scanning electron microscope. Therefore, in the process of controlling pattern dimensions using a scanning electron microscope, a technique to distinguish the difference in the cross-sectional shapes of resist patterns is needed in addition to computation of length measurement values.

Figure 7A:
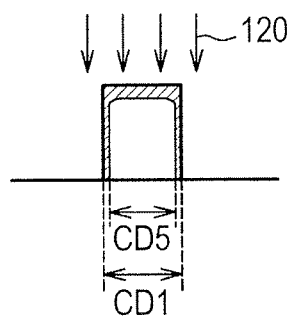

As for the two resist patterns shown in FIGS. 6A and 6B, FIG. 7 show resist shrinkage caused by electron beam irradiation and the pattern dimensions measured at that time. Electron beams 120 are indicated by arrows and the areas where shrinkage occurs due to irradiation with the electron beams 120 are indicated by hatching. First, in the case of FIG. 7A, the electron beams 120 are thrown on the pattern from above, so the upper side is irradiated with the electron beams but the lateral sides are scarcely irradiated. Therefore, depending on the irradiation level, the amount of shrinkage of the upper side of the pattern is large but the amount of shrinkage of the lateral sides is small. Here, the pattern dimension is CD5, which is slightly smaller than the length measurement value CD1 before shrinkage.

Figure 7B:
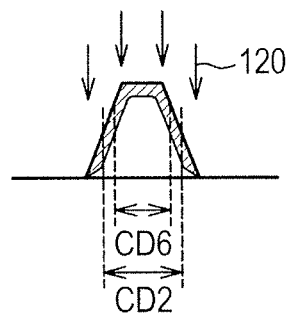

On the other hand, in the pattern shown in FIG. 7B, the amount of shrinkage of the upper side is the same as in FIG. 7A because the level of irradiation with electron beams 120 is the same, but the lateral sides are extensively irradiated with electron beams 120, so the amount of shrinkage is larger than in FIG. 7A and the length measurement value largely decreases from CD2 to CD6.

Figure 8:
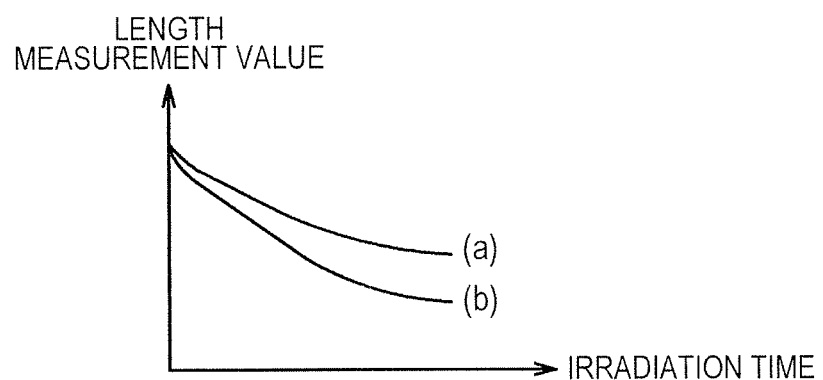
FIG. 8 is a view showing changes in the length measurement values of the patterns shown in FIGS. 6A and 6B.

FIG. 8 shows change in length measurement value which is a function of electron beam irradiation time for these two resist patterns. It is assumed here that although the cross-sectional shapes of the pattern (a) and pattern (b) are different, the same length measurement value is obtained. When these patterns are irradiated with electron beams, the resist patterns shrink and as mentioned above, the amount of shrinkage is different between the patterns A and B and the length measurement value of the patter B changes more largely than that of the pattern (a).

Pattern control accuracy can be increased by checking shrinkage amount differences and detecting not only length measurement values but also cross-sectional shape differences of resist patterns after development in the photolithographic process in this way. A concrete usage is to find a pattern whose shape is different from its original shape, in which a shape difference is evaluated by comparing deviation from previously acquired reference data or deviation from the result obtained about the same type of pattern against a preset value. If there is deviation from the preset value, an error is displayed.

For the above purpose, it is important to be able to discriminate the difference between two types of patterns in the curve of length measurement value changing due to shrinkage. Therefore, regarding the number of frames, it should be finely subdivided so that change in length measurement value can be recognized and since length measurement accuracy should be kept sufficiently high, so frame-by-frame analysis is desirable.

In addition, pattern information at different times can be obtained by saving images in video image format. This offers merits that it is easy to make analysis if an error in the process is found and plural pieces of pattern information can be obtained over time. Conversely, if such analysis is not made, it is unnecessary to save separated images or video images and only the image for use in length measurement and the obtained pattern information are finally saved, so the system can be simplified.

Although the above explanation assumes the use of electron beams, it is not limited to electron beams but can be applied to a microscope which uses ion beams.

As described above, according to this embodiment, it is possible to provide a charged particle beam microscope which can obtain information about the materials and stereo-structure of a pattern without lowering throughput of pattern dimension measurement, by obtaining pattern information using a separated image constituting an image for length measurement. Particularly, the pattern cross-sectional shape can be estimated by finding change in length measurement values over time.

Second Embodiment

A second embodiment will be described referring to FIG. 9 and FIG. 10. What has been described about the first embodiment is also applicable to this embodiment unless there are special circumstances. In this embodiment, zero shrinkage presumption will be explained.

Figure 9A:
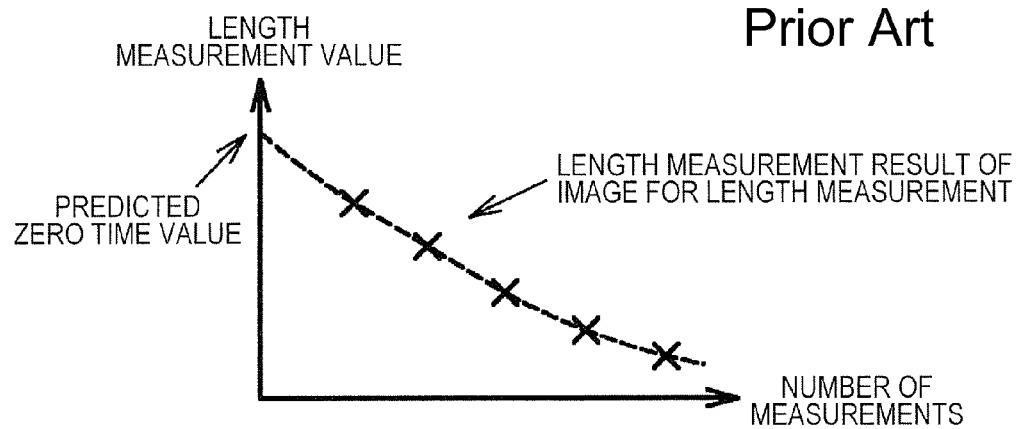
Figure 9B:
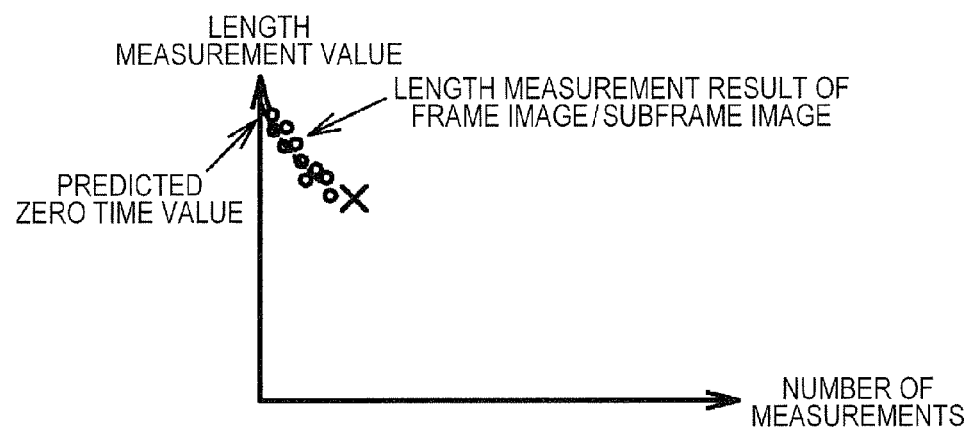

FIG. 9 show a method of measuring dimensions before shrinkage by comparison with the conventional method. FIG. 9A shows the conventional method of calculating zero time values and FIG. 9B shows the method according to the present invention.

First, FIG. 9A is explained. The process of acquiring an image for length measurement by scanning the spot to be observed more than once is first carried out more than once and the length measurement value of each image for length measurement is calculated. The length measurement value is plotted on the vertical axis versus the number of measurements on the horizontal axis. Since the resist pattern tends to have a characteristic that it shrinks due to electron beam irradiation, the length measurement value gradually decreases as the number of measurements increases (irradiation time elapses). Next, by fitting an approximate line to the measuring points, the intercept with the vertical axis is calculated as the length measurement value before shrinkage. This value is called zero time value.

Although this method assures high accuracy, a plurality of images for length measurement must be acquired and it takes longer measuring time and the zero time value accuracy is largely influenced by the fitting accuracy. Furthermore, it has a problem that the observed spot seriously shrinks and cannot be used as a circuit element after pattern dimension measurement.

Next, FIG. 9B which shows this embodiment is explained. Here, length measurement is made using a separated image constituting an image for length measurement and the result of length measurement is plotted like FIG. 9A. While the condition nearest to the zero time value is the length measurement value of the first image for length measurement in the case of FIG. 9A, here it is the length measurement value of the first separated image, so an error from the zero time value error is smaller. As for the magnitude of the zero time value, the length measurement value of the first separated image is used, but instead the intercept with the vertical axis obtained by fitting an approximate curve to plural length measurement values of separated images may be used.

Here, since the length measurement accuracy of a separated image is lower than the length measurement accuracy of an image for length measurement, the absolute value of length measurement value may be adjusted to the length measurement value of the image for length measurement in order to enhance the length measurement accuracy. In order to enhance the accuracy further, a technique in which two images for length measurement are acquired and separated images corresponding to them are plotted to equalize the absolute values may be adopted. Therefore, by calculating and checking length measurement values using separated images, the dimension of zero time value can be computed with higher accuracy than before.

For the above purpose, it is important to check length measurement values closely, so the number of frames should be as small as possible and it is preferable to make analysis on each single frame or each subframe.

Figure 10:
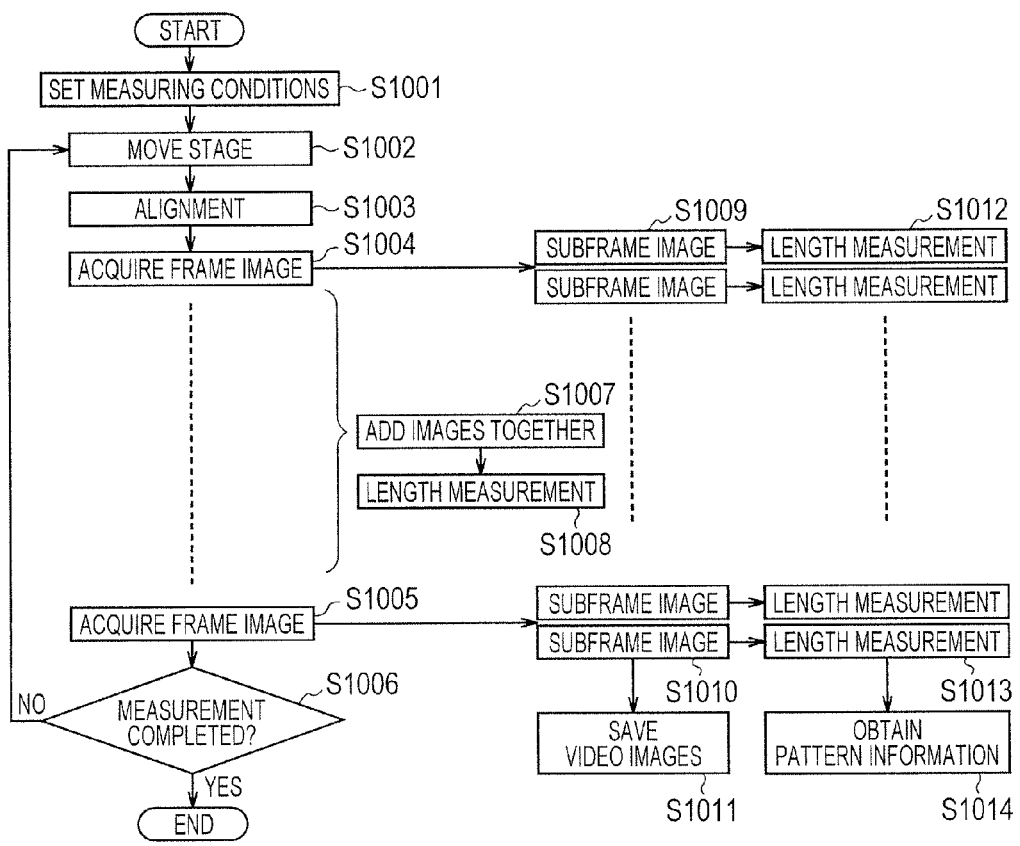
FIG. 10 is a flowchart showing the sequence of obtaining pattern dimensions and pattern information using the scanning electron microscope according to the second embodiment.

FIG. 10 is a flowchart showing the process of making analysis on subframes one by one. S1001 to S1008 are the same processing steps as S301 to S308.

First, the frame images acquired at S1004 and S1005 are divided into subframe images, which are then saved in the image memory 112 (S1009, S1010). Then the subframe images are saved in video image format (S1011).

Next, length measurement values of the subframe images saved at S1009 and S1010 are computed (S1012, S1013). If the length measurement accuracy of the subframe images is not sufficient, it is desirable to improve the clearness of the subframe images by image processing. For image processing to improve the image clearness, a technique to emphasize an edge in the image using an image filter may be adopted, but not only the use of an image filter but also any other technique may be adopted as far as the measurement accuracy is improved.

Last, pattern information is obtained using the length measurement values of the subframe images acquired at S1012 and S1013 (S1014).

FIG. 11 illustrate a method of forming subframe images using interlace scanning as a typical scanning method. For simplicity, the number of image scanning lines is 16. Interlace scanning is a technique in which after the odd-numbered lines of an image are scanned from top sequentially, the even-numbered lines are scanned from top sequentially to make up a single image. Here, an image acquired by scanning odd-numbered lines and an image acquired by scanning even-numbered lines are taken as subframe images.

Figure 11A:
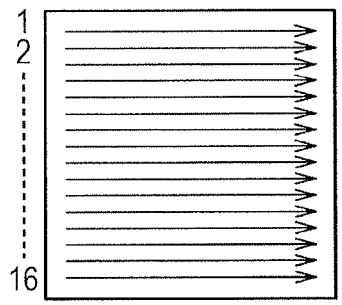
FIGS. 11A, 11B and 11C are an example of subframe images in a separated image.
Figure 11B:
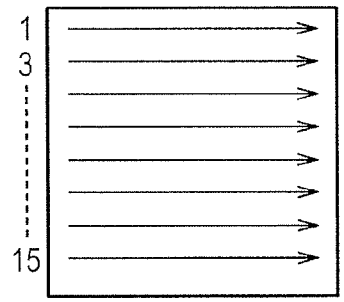
Figure 11C:
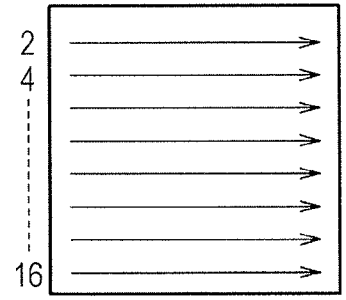

FIG. 11A shows a frame image, FIG. 11B shows a subframe image acquired by scanning odd-numbered lines and FIG. 11C shows a subframe image acquired by scanning even-numbered lines. As a method of making subframe images in this embodiment, a method in which the image is divided into odd-numbered scanning lines and even-numbered scanning lines so that the whole image can be grasped and the pattern can be easily identified has been described, but a method in which the image is divided into upper and lower parts to make subframe images is also available.

As described above, according to this embodiment, it is possible to provide a charged particle beam microscope which can obtain information about the materials and stereo-structure of a pattern without lowering throughput of pattern dimension measurement, by obtaining pattern information using a separated image constituting an image for length measurement. Particularly, the zero time value can be known from the relation between the number of measurements of separated images and length measurement values.

Third Embodiment

A third embodiment will be described referring to FIG. 12 and FIG. 13. What has been described about the first embodiment is also applicable to this embodiment unless there are special circumstances. In this embodiment, an explanation is given of a technique of deciding whether for a resist pattern it is a pattern to remain intact (Line pattern) or a portion to be lost (Space pattern).

Figure 12A:
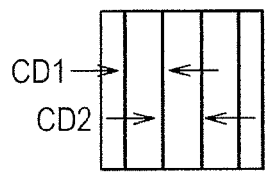

FIG. 12A shows an example of an image of a pattern being observed. Shown here is an example that no difference in shading contrast is seen between the Line portions and Space portions. Not only in this case, this technique can be applied in a case that shading is seen but discrimination between patterns to remain intact and portions to be lost is impossible or a case that the shading contrast of a pattern changes during observation. In order to address this problem, in this embodiment, length measurement values of neighboring pattern widths CD1 and CD2 are measured.

Figure 12B:
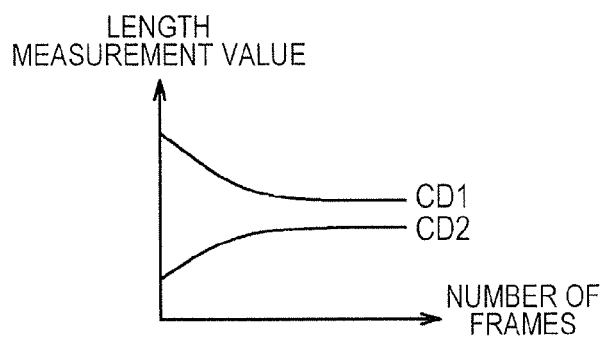

FIG. 12B shows the result of observation of change in length measurement values of CD1 and CD2 over time. As time elapses (the number of frames increases), CD1 decreases and accordingly CD2 increases. Since the resist has properties that it shrinks with electron beam irradiation, it can be known that the portion corresponding to CD1 is the resist and the portion corresponding to CD2 is the underlayer.

Figure 12C:
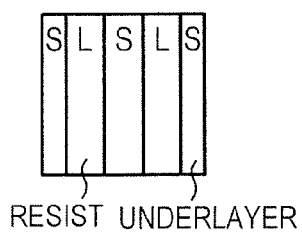

From the result obtained, markings L (Line) and S (Space) are given at the upper parts of the patterns as shown in FIG. 12C. However, instead of marking the patterns, whether a pattern is either Line or Space may be written in an image condition file or the image may be colored for marking.

For the above purpose, it is sufficient to be able to know whether the two length measurement values CD1 and CD2 increase or decrease, and since the number of frames should be increased to enhance the length measurement accuracy, it is desirable to make analysis using multiple-frame images of four or more frames.

Figure 13:
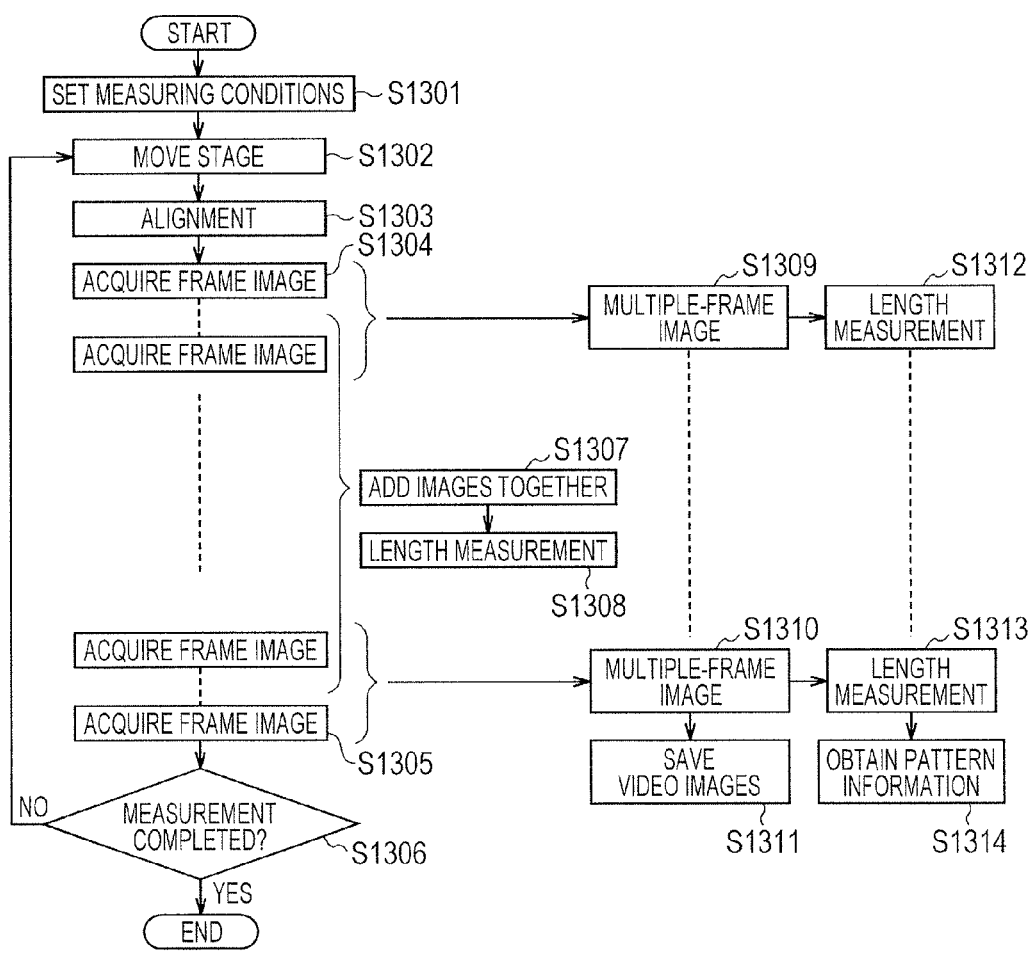
FIG. 13 is a flowchart showing the sequence of discriminating Line and Space using the scanning electron microscope according to the third embodiment.

FIG. 13 is a flowchart showing the process of making analysis on each multiple frame. S1301 to S1308 are the same processing steps as S301 to S308.

First, the frame images acquired at S1304 and S1305 are combined into small groups to form multiple-frame images, which are then saved in the image memory 112 (S1309, S1310). Then the multiple-frame images are saved in video image format (S1311). Next, the length measurement values of the multiple-frame images saved at S1309 and S1310 are computed (S1312, S1313).

The length measurement accuracy of multiple-frame images is higher than that of frame images, but it is desirable to achieve a higher length measurement accuracy by further improving the clearness by image processing. For image processing to improve the image clearness, a technique to emphasize an edge in the image using an image filter may be adopted, but not only the use of an image filter but also any other technique may be adopted as far as the measurement accuracy is improved.

Last, pattern information is obtained using the length measurement values of the multiple-frame images acquired at S1312 and S1313 (S1314).

As described above, according to this embodiment, it is possible to provide a charged particle beam microscope which can obtain information about the materials and stereostructure of a pattern without lowering throughput of pattern dimension measurement, by obtaining pattern information using a separated image constituting an image for length measurement. Particularly, whether for the resist pattern it is a pattern to remain intact (Line pattern) or a portion to be lost (Space pattern) can be decided from change in length measurement value over time.

Fourth Embodiment

A fourth embodiment will be described referring to FIG. 14 and FIG. 15. What has been described about the first embodiment is also applicable to this embodiment unless there are special circumstances. In this embodiment, an explanation is given of a technique of presuming the materials of a pattern.

Figure 14A:
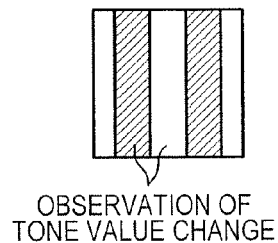

FIG. 14A shows an example of an image which has been observed. Here, for a conductor-insulator combination pattern as a typical example, a method of checking which portion corresponds to conductor is explained. It is assumed that the materials of conductor and insulator are known. The above purpose is often used for photo masks in which chromium as conductor is patterned on a quartz substrate as an insulator.

Figure 14B:
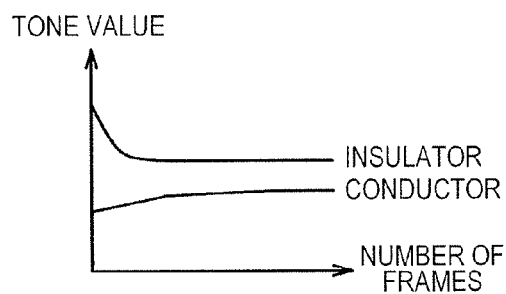

FIG. 14B shows the result of observation of change in tone value over time of a conductor-insulator combination pattern like this. The change in tone value is largely influenced by the charged state of the sample surface. The charged state varies depending on the sample material, which means that the sample material can be known by observation of change in tone value. While in the case of insulator the charge on the sample surface is saturated a short time after the start of electron beam irradiation, in the case of conductor the charge spreads all over the conductor and electrification proceeds gradually. In other words, the following characteristics are seen: while the tone value of insulator rapidly changes in a short time and then stagnates, the tone value of conductor gradually changes. Which portion of the pattern is conductor or insulator can be decided by checking change in tone value like this.

Figure 14C:
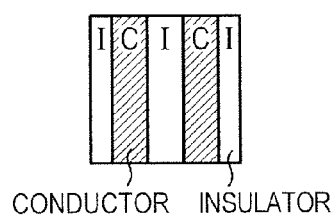

From the result obtained, markings C (Conductor) and I (Insulator) are given at the upper parts of the patterns as shown in FIG. 14C. However, instead of marking the patterns, which pattern is conductor or insulator may be written in an image condition file or the image may be colored for marking. Markings to show either conductor or insulator are given here on the assumption that it is a photo mask, but charging characteristics vary form material to material, so it is also acceptable to presume the material based on reference in which the characteristics of each material are described and write it in an image condition file.

For the above purpose, it is important to be able to discriminate the difference between two patterns in change in tone value, so regarding the number of frames, it should be somewhat finely divided and it is desirable to make analysis on each single frame or each subframe.

Figure 15:
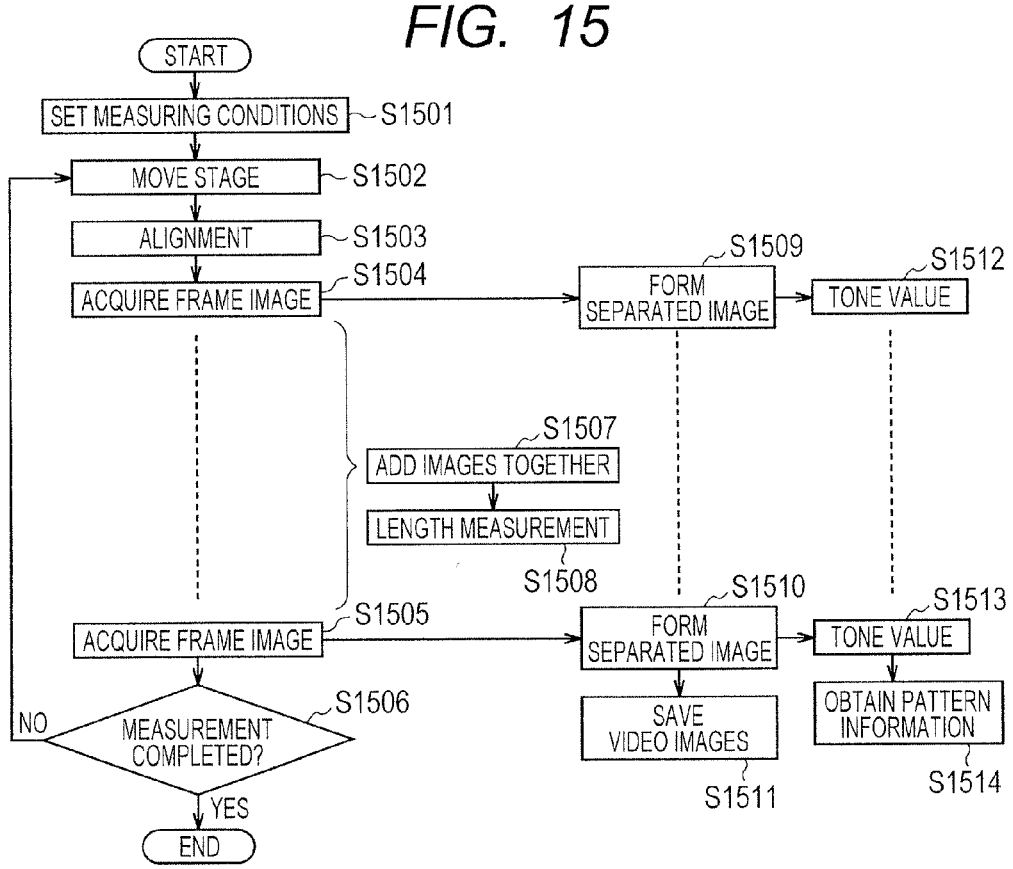
FIG. 15 is a flowchart showing the sequence of presuming the materials of a pattern using the scanning electron microscope according to the third embodiment.

FIG. 15 is a flowchart showing the processing sequence according to this embodiment. S1501 to S1511 are the same processing steps as S301 to S311. At S1512 and S1513, not the length measurement value but the tone value of each pattern in an image is computed, Pattern information is obtained using these tone values (S1514).

As described above, according to this embodiment, it is possible to provide a charged particle beam microscope which can obtain information about the materials and stereostructure of a pattern without lowering throughput of pattern dimension measurement, by obtaining pattern information using a separated image constituting an image for length measurement. Particularly, whether a pattern is conductor or insulator can be decided from change in tone value over time.

Fifth Embodiment

A fifth embodiment will be described referring to FIG. 16 and FIG. 17. What has been described about the first embodiment is also applicable to this embodiment unless there are special circumstances.

Figure 16:
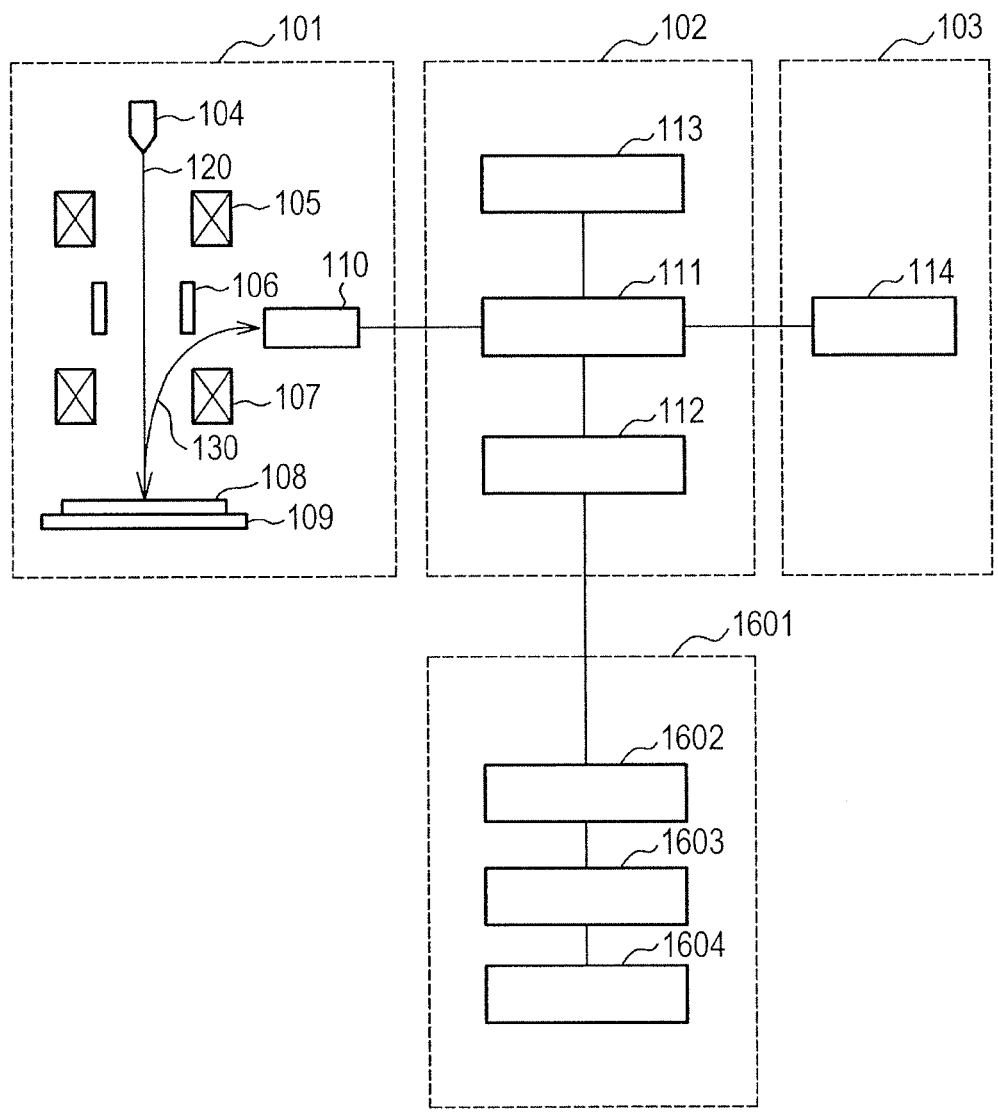
FIG. 16 is a view showing the general configuration of a scanning electron microscope according to a fifth embodiment.

FIG. 16 is a view showing the configuration of a scanning electron microscope according to this embodiment. In this embodiment, video image data obtained through the electron scanning microscope is transmitted to an image processing server and extracted as still images in the image processing server to obtain pattern information. The image data saved in the image memory 112 of the control unit 102 of the scanning electron microscope is transmitted in video image format to the image memory 1602 of the image processing server 1601. The video image data is extracted as still images in an image extraction section 1603 and pattern information is obtained in a data processing section 1604.

Figure 17:
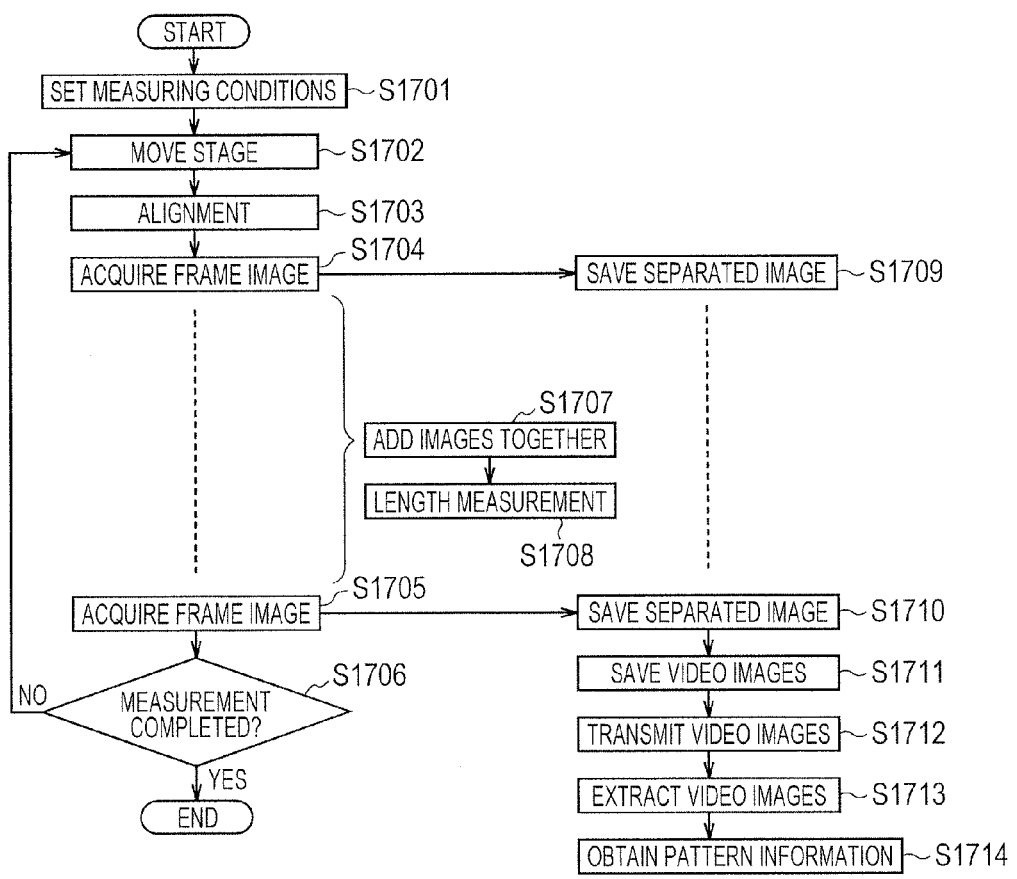
FIG. 17 is a flowchart showing the sequence of obtaining pattern dimensions and pattern information using the scanning electron microscope according to the fifth embodiment.

FIG. 17 is a flowchart showing the processing sequence according to this embodiment. While in the case of FIG. 3 length measurement is carried out simultaneously with image acquisition to obtain pattern information, in this embodiment pattern information is obtained offline after all image data is transmitted to the server for the scanning electron microscope. S1701 to S1711 are the same processing steps as S301 to S311.

The video image data saved at S1711 is transmitted to the image memory 1602 of the image processing server 1601 (S1712). Then, the transmitted video image data is extracted as still images for the analysis of image information (S1713) to obtain pattern information (S1714).

In this embodiment, instead of analyzing image data by the control unit of the scanning electron microscope as in the first embodiment to obtain pattern information, image data is transmitted to the image processing server for analysis, so transmission of image data is an important issue. Since the volumes of still images such as frame images are large and data transmission is burdensome, the data volume is compressed by converting still images into video images so that the strain in data transmission can be reduced. In addition, since the internal memory is not consumed to obtain pattern information, the load on the scanning electron microscope can be reduced.

As described above, according to this embodiment, it is possible to provide a charged particle beam microscope which can obtain information about the materials and stereostructure of a pattern without lowering throughput of pattern dimension measurement, by obtaining pattern information using a separated image constituting an image for length measurement. In addition, since the internal memory is not consumed to obtain pattern information, the load on the charged particle beam microscope can be reduced.

So far the present invention has been described in detail; main forms of the invention are listed below:

(1) A charged particle beam microscope which acquires a plurality of frame images by scanning the field of view of a sample and computes the dimensions of a pattern formed on the sample using an image for length measurement made by adding the images together, characterized in that information about the materials and stereostructure of the pattern is created using a separated image as an image made by adding together a smaller number of frames than the number of acquired frames or a single frame image or subframe image.

(2) The charged particle beam microscope as described above in (1), characterized in that the number of frames of a separated image to be saved can be selected depending on information about the materials and stereostructure of a pattern which is obtained.

(3) The charged particle beam microscope as described above in (1), characterized in that the separated image is saved in video image format using a video image compression technique.

(4) The charged particle beam microscope as described above in (3), characterized in that the compression ratio of video images can be selected depending on information about the materials and stereostructure of a material which is obtained.

(5) The charged particle beam microscope as described above in (1), characterized in that a resist pattern stereostructure difference can be presumed from a difference in an amount of resist shrinkage due to irradiation with a charged particle beam.

(6) The charged particle beam microscope as described above in (1), characterized in that an initial pattern dimension is computed from pattern dimensional changes in multiple frames.

(7) The charged particle beam microscope as described above in (1), characterized in that whether a resist pattern portion is a portion to be lost or a portion to remain intact is decided from pattern dimensional changes of two or more portions in multiple frames.

(8) The charged particle beam microscope as described above in (1), characterized in that materials are presumed from tone value changes in multiple frames.

REFERENCE SIGNS LIST

101 . . . Electron microscope unit
102 . . . Control unit
103 . . . Display unit
104 . . . Electron source
105 . . . Condenser lens
106 . . . Deflector
107 . . . Objective lens
108 . . . Sample
109 . . . Sample stage
110 . . . Detector
111 . . . Data processing section
112 . . . Image memory
113 . . . Arithmetic processing section
114 . . . Monitor
120 . . . Electron beam
130 . . . Secondary electrons or reflected electrons
1601 . . . Image processing server
1602 . . . Image memory
1603 . . . Image extraction section
1604 . . . Data processing section

The invention claimed is:

1. A charged particle beam microscope comprising:
a microscope unit including a charged particle source, a sample stage, and a detector for detecting charged particles from a sample placed on the sample stage due to irradiation with charged particles emitted from the charged particle source; and
a control unit including a data processing section for converting a detection signal from the detector into a frame image and adding together a plurality of frame images to make an image for length measurement, an image memory for saving the frame images, and an arithmetic processing section for computing dimensions of a pattern formed on the sample from the image for length measurement,
wherein the data processing section has a function to form a plurality of multiple-frame images by adding together a smaller number of frames than the number of frames constituting the image for length measurement, a plurality of single frame images, or a plurality of subframe images by using the plurality of frame images provided for configuring the image for length measurement, and, in parallel, to generate identification information of a pattern depending on specific changes of frame number of the pattern included in the plurality of multiple-frame images, the plurality of single frame images, or the plurality of subframe images, or depending on specific changes of length measurement value or tone value based on changes in irradiation time of the charged particles.

2. The charged particle beam microscope according to claim 1, wherein the number of frames of the separated image is selected depending on information about materials and stereostructure of the pattern which is obtained.

3. The charged particle beam microscope according to claim 1, wherein the separated image is saved in video image format in the image memory using a video image compression technique.

4. The charged particle beam microscope according to claim 3, wherein a compression ratio of the video images is selected depending on information about materials and stereostructure of the pattern which is obtained.

5. The charged particle beam microscope according to claim 1, wherein the pattern formed on the sample is a resist pattern and stereostructure of the resist pattern is presumed from a relation between a length measurement value of the resist pattern obtained based on the separated image and time of irradiation with the charged particles.

6. The charged particle beam microscope according to claim 1, wherein the pattern formed on the sample is a resist pattern and dimensions of the resist pattern before irradiation with the charged particles are calculated from a relation between a length measurement value of the resist pattern obtained based on the separated image and the number of measurements of the separated image.

7. The charged particle beam microscope according to claim 1, wherein the pattern formed on the sample is a resist pattern and a decision as to whether a portion of the resist pattern is a portion to be lost or a portion to remain intact is made using a relation between length measurement values of the portion to be lost and the portion to remain intact of the resist pattern obtained based on the separated image and the number of frames of the separated image.

8. The charged particle beam microscope according to claim 1, wherein presumption of materials of the pattern formed on the sample is made using a relation between a pattern tone value obtained based on the separated image and the number of frames of the separated image.

* * * * *